US008766216B2

(12) United States Patent
Kawamoto

(10) Patent No.: US 8,766,216 B2
(45) Date of Patent: Jul. 1, 2014

(54) DRAWING APPARATUS, AND ARTICLE MANUFACTURING METHOD

(75) Inventor: Takayuki Kawamoto, Tokyo (JP)

(73) Assignee: Canon Kabushiki Kaisha (JP)

( * ) Notice: Subject to any disclaimer, the term of this patent is extended or adjusted under 35 U.S.C. 154(b) by 113 days.

(21) Appl. No.: 13/607,925

(22) Filed: Sep. 10, 2012

(65) Prior Publication Data

US 2013/0068962 A1 Mar. 21, 2013

(30) Foreign Application Priority Data

Sep. 21, 2011 (JP) ................................ 2011-206558

(51) Int. Cl.
*H01J 37/302* (2006.01)
*H01J 37/04* (2006.01)

(52) U.S. Cl.
USPC ................ 250/492.22; 250/491.1; 250/492.2; 250/492.1; 250/492.3; 250/396 R

(58) Field of Classification Search
USPC ............................... 250/491.1, 492.2, 492.22
See application file for complete search history.

(56) References Cited

U.S. PATENT DOCUMENTS

| | | | | |
|---|---|---|---|---|
| 6,483,120 | B1 * | 11/2002 | Yui et al. | 250/491.1 |
| 6,835,937 | B1 * | 12/2004 | Muraki et al. | 250/396 R |
| 6,870,171 | B2 * | 3/2005 | Hosoda et al. | 250/492.22 |
| 2012/0107748 | A1 * | 5/2012 | Morita | 430/325 |
| 2012/0115306 | A1 * | 5/2012 | Yamazaki et al. | 438/460 |
| 2012/0126138 | A1 * | 5/2012 | Ozawa | 250/397 |
| 2012/0164583 | A1 * | 6/2012 | Yamaguchi et al. | 430/296 |

FOREIGN PATENT DOCUMENTS

| | | | |
|---|---|---|---|
| JP | 2006-245176 | A | 9/2006 |
| JP | 4-313145 | A | 8/2009 |
| WO | 2009/147202 | A1 | 12/2009 |

* cited by examiner

*Primary Examiner* — Nikita Wells
*Assistant Examiner* — Johnnie L Smith
(74) *Attorney, Agent, or Firm* — Rossi, Kimms & McDowell, LLP

(57) ABSTRACT

A drawing apparatus include: a charged particle optical system configured to generate M×N charged particle beams; a limiting device configured to limit number of charged particle beams that the charged particle optical system emits toward a substrate; and a controller configured, if an abnormal beam that does not satisfy a use condition is present among the M×N charged particle beams, to control the limiting device such that only m rows, each of the m rows including n charged particle beams that are successive without intervention of the abnormal beam.

13 Claims, 13 Drawing Sheets

DRAWING APPARATUS, AND ARTICLE MANUFACTURING METHOD

BACKGROUND OF THE INVENTION

1. Field of the Invention

The present invention relates to a drawing apparatus for performing drawing on a substrate with a plurality of charged particle beams, and an article manufacturing method.

2. Description of the Related Art

As a circuit pattern becomes extremely fine, and its integration degree rises, a drawing apparatus for directly drawing the pattern on a substrate has strongly been required to not only be highly accurate but also have a high throughput. As a drawing apparatus capable of meeting these requirements, there exists a multi-beam drawing apparatus which draws a pattern on a substrate using a plurality of charged particle beams. International Publication No. 2009/147202 proposes a drawing apparatus which draws continuous stripe areas on a substrate by further dividing a plurality of charged particle beams to form sub-beams and individually turning on/off, deflecting, and scanning them in accordance with a pattern to be drawn. If the generated charged particle beams and sub-beams include defective beams, the desired pattern cannot be drawn on the substrate. However, no method of coping with it is mentioned in International Publication No. 2009/147202. Japanese Patent No. 4313145 and Japanese Patent Laid-Open No. 2006-245176 propose multi-beam drawing apparatuses in which each a plurality of charged particle beams draws an area of responsibility on a substrate. In these drawing apparatuses, abnormal charged particle beams are shielded with respect to the substrate, unlike the drawing apparatus proposed in International Publication No. 2009/147202.

When a specific charged particle beam (group) is shielded with respect to the substrate in the multi-beam drawing apparatus of International Publication No. 2009/147202, as described in Japanese Patent No. 4313145 and Japanese Patent Laid-Open No. 2006-245176, continuous stripe areas cannot be drawn, although generation of defective stripes can be avoided.

SUMMARY OF THE INVENTION

The present invention provides, for example, a drawing apparatus advantageous in performing drawing on a substrate even if an abnormal charged particle beam exists.

The present invention in its one aspect provides a drawing apparatus for performing drawing on a substrate with charged particle beams, the apparatus comprising: a charged particle optical system configured, letting m, n, and i be natural numbers, letting M be a natural number not less than m, and letting N be a natural number not less than n, to generate M×N charged particle beams arranged such that M rows, each including N charged particle beams arranged at a first pitch along a first direction, exist at a second pitch along a second direction perpendicular to the first direction, a position, in the first direction, of a charged particle beam at a start of each row shifts by 1/m the first pitch in first to mth rows out of the M rows, and a position, in the first direction, of a charged particle beam at a start of an (m+i)th row is the same as a position, in the first direction, of a charged particle beam at a start of an ith row; a substrate stage configured to hold the substrate and to be moved along the second direction; a limiting device configured to limit number of charged particle beams that the charged particle optical system emits toward the substrate; and a controller configured, if an abnormal beam that does not satisfy a use condition is present among the M×N charged particle beams, to control the limiting device such that only m rows, successive along the second direction, are usable, each of the m rows including n charged particle beams that are successive without intervention of the abnormal beam.

Further features of the present invention will become apparent from the following description of exemplary embodiments with reference to the attached drawings.

DESCRIPTION OF THE EMBODIMENTS

Figure 1:
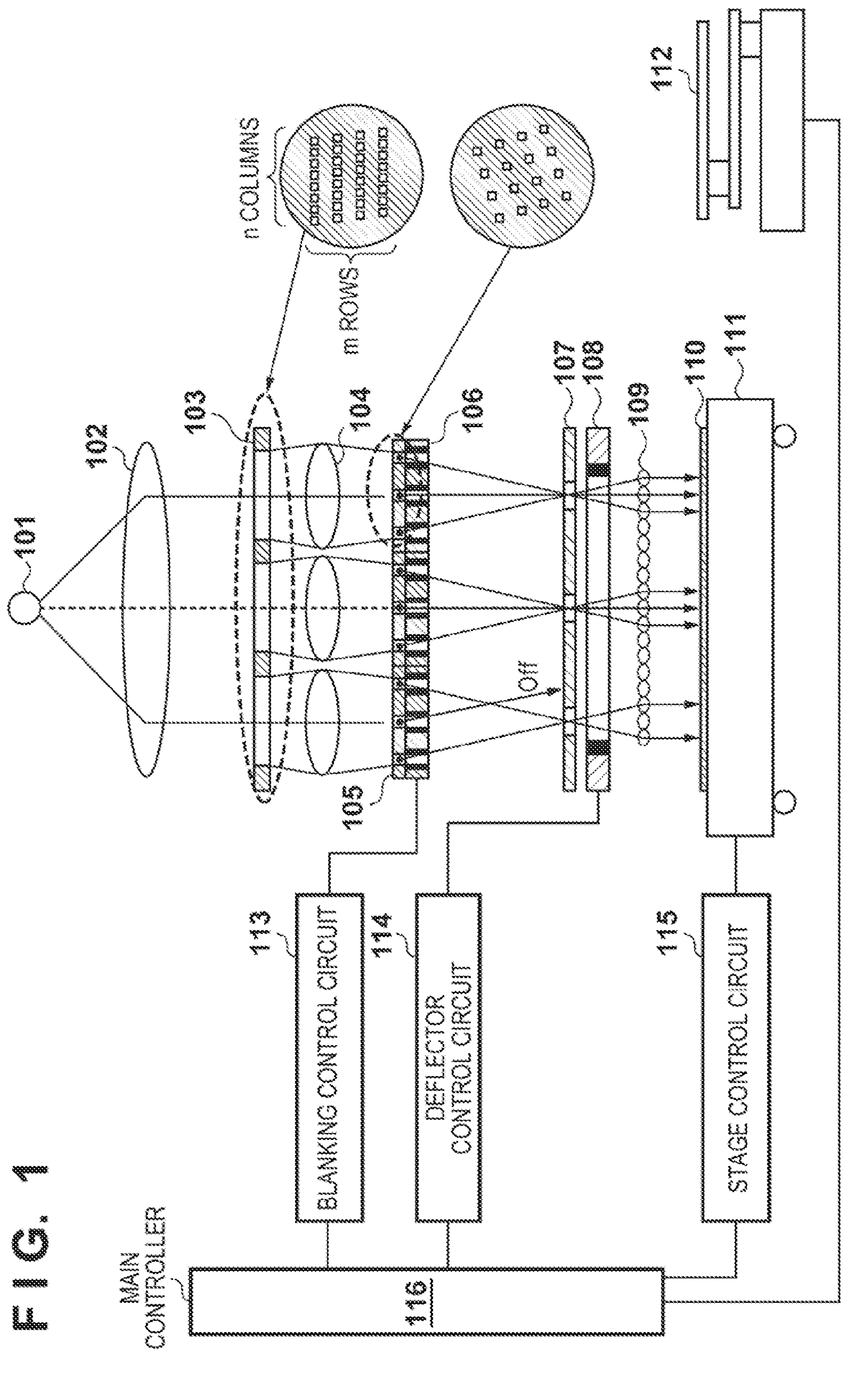
FIG. 1 is a view showing an example of the arrangement of a drawing apparatus.

The embodiments of the present invention will now be described with reference to the accompanying drawings. Note that the same reference numerals denote the same members and the like throughout the drawings in principle, and a repetitive description thereof will be omitted. FIG. 1 shows an example of the arrangement of a multi-beam drawing apparatus. Charged particles generated by a charged particle source 101 are made almost parallel to the optical axis by a collimator lens 102. The charged particles are then incident on part of an aperture array 103 having two-dimensionally arranged openings so as to generate a plurality of charged particle beams.

The charged particle beams pass through condenser lenses two-dimensionally arranged on a condenser lens array 104, and are incident on pattern openings (sub-arrays) two-dimensionally arranged on a pattern opening array 105. A sub-array has at least one opening. Each charged particle beam passes through a sub-array so as to form further divided sub-beams. A blanker array (blanking deflector) 106 includes electrostatic blankers (electrode pairs) individually drivable for each sub-beam. Each blanker controls (on/off-controls) whether or not to emit a sub-beam to a substrate 110 through a corresponding one of openings two-dimensionally arranged on a blanking aperture 107 depending on whether or not to deflect the sub-beam. Each sub-beam that has passed through the blanking aperture 107 is deflected in a predetermined direction by a deflector 108. After that, the sub-beam forms an image on the substrate 110 through an objective lens arranged on an objective lens array 109. The surface of the pattern opening array 105 on which the sub-arrays are arranged is the object plane. The upper surface of the substrate 110 is the image plane. The condenser lens array 104 and the objective lens array 109 constitute a projection system (charged particle optical system) that projects the charged particle beams generated by the charged particle source 101 onto the substrate 110.

A substrate stage 111 can move while holding the substrate 110. A conveyance mechanism 112 transfers/receives the substrate 110 to/from the substrate stage 111. A main controller 116 comprehensively controls the drawing apparatus by controlling a blanking control circuit 113, a deflector control circuit 114, and a stage control circuit 115. The blanking control circuit 113 individually controls the plurality of blankers. The deflector control circuit 114 controls the deflector 108. The stage control circuit 115 controls positioning of the substrate stage 111 in cooperation with laser interferometers (not shown).

Figure 2A:
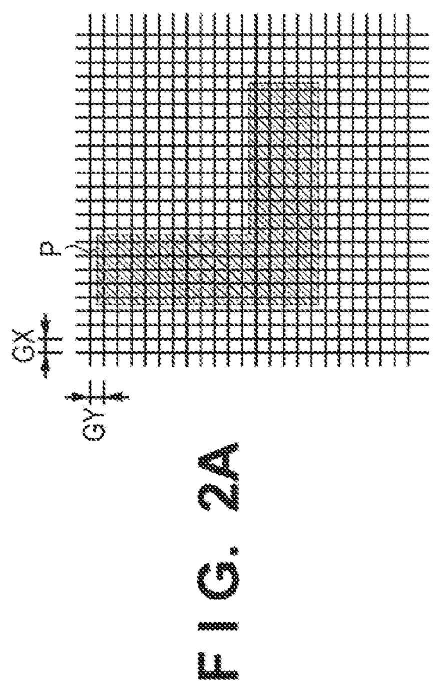
FIGS. 2A to 2D are views for explaining a drawing method.

FIGS. 2A to 2D explain multi-beam drawing by a drawing apparatus in which the aperture array 103 has openings in 4 rows×8 columns, and one sub-array has openings in 4 rows×4 columns. As shown in FIG. 2A, each sub-beam is assigned on/off at a corresponding grid point (X- and Y-direction pitches are GX and GY) based on a drawing pattern P. The X and Y directions are first and second directions perpendicular to each other and parallel to the surface of the substrate 110. The Y direction that is the second direction is the direction in which the substrate 110 is moved by the substrate stage 111.

Figure 2B:
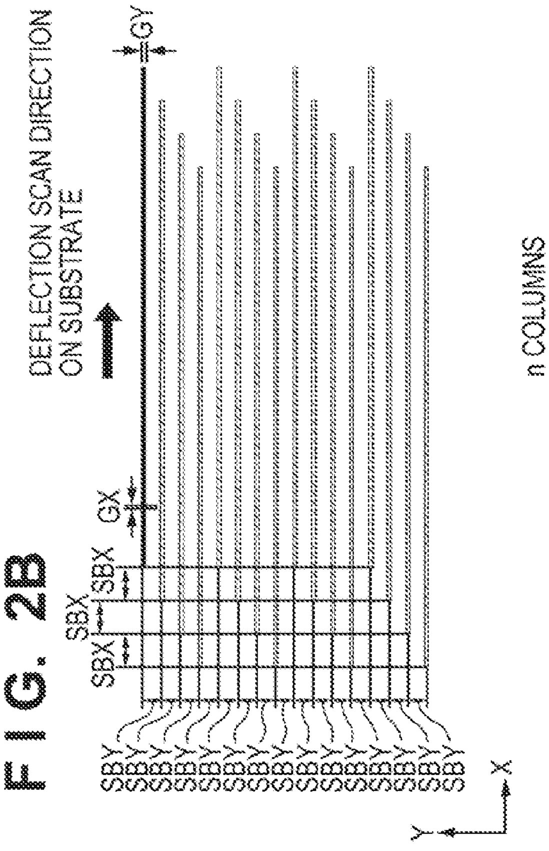

FIG. 2B shows loci drawn on the substrate 110 upon scanning by one-time deflection of a sub-beam group from one sub-array. The sub-beams form images on the substrate 110 at an X-direction pitch SBX and a Y-direction pitch SBY. The Y-direction size of each image matches the grid pitch GY. The substrate stage 111 continuously moves in the Y direction. The deflector 108 deflects each sub-beam in the X and Y directions so as to draw a locus in the X direction when viewed from the substrate 110. Each sub-beam is on/off-controlled at each grid point defined by the grid pitch GX. The locus of the uppermost sub-beam is expressed solid for the descriptive convenience.

Figure 2C:
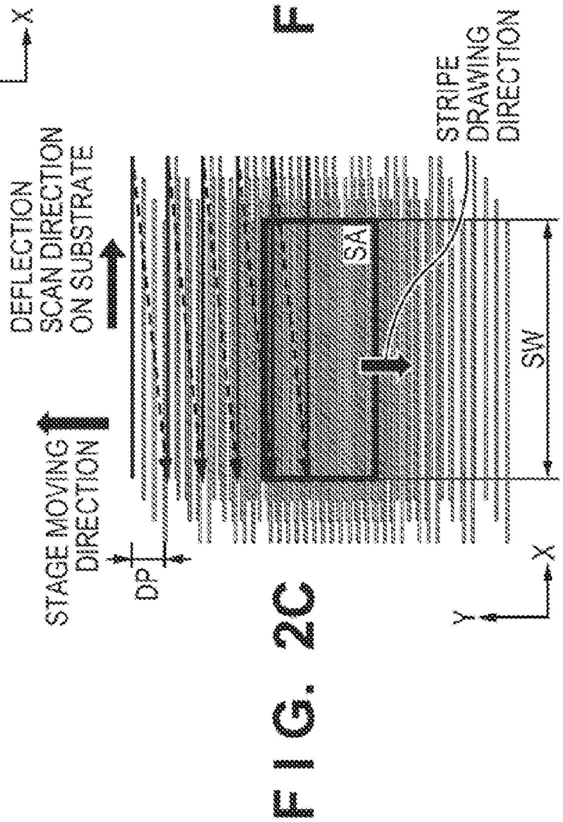

FIG. 2C shows a state in which a stripe area is drawn on the substrate 110 upon scanning by a plurality of times of deflection of a sub-beam group from one sub-array. Since the substrate stage 111 continuously moves in the Y direction, scanning by deflection is sequentially repeated via flyback at a deflection width DP in the Y direction as indicated by broken arrows. Since the area represented by the bold frame is filled with the loci of the sub-beams, a stripe area SA having a width SW is drawn in the Y direction. As the conditions to do this, when the number of sub-beams from one sub-array is $N^2$, $$N^2=K\times L+1 \text{ (}K\text{ and }L\text{ are natural numbers)} \quad (1)$$

$$SBY=GY\times K \quad (2)$$

$$DP=(K\times L+1)\times GY=N^2\times GY \quad (3)$$

need to be satisfied.

Figure 2D:
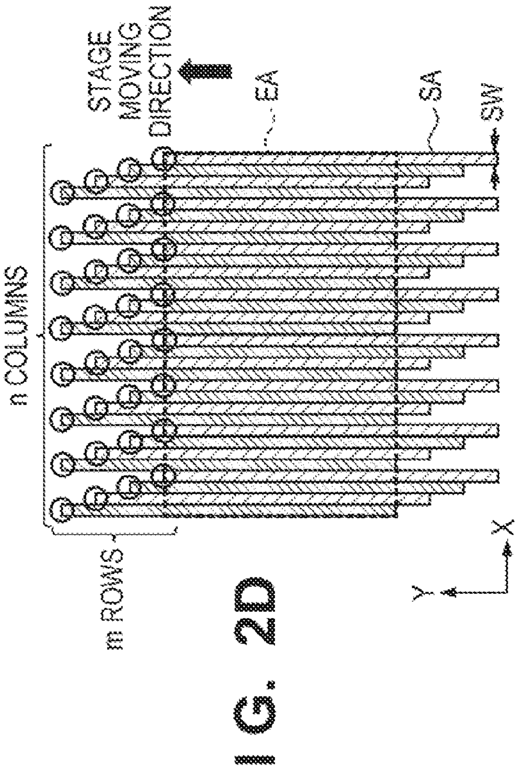

In these conditions, when the sub-beam interval SBY in the Y direction is determined as in equation (2) by K that satisfies equation (1), a fine pattern can be drawn by reducing the scan grid interval GY without reducing the opening or blanker interval that is limited in terms of manufacturing. Additionally, when the deflection width DP in the Y direction is determined as in equation (3), drawing at the grid pitch GY is possible at any portion in the stripe area SA. In the example shown in FIG. 2C, N=4, K=5, and L=3. FIG. 2D explains the positional relationship of the stripe areas SA drawn by the plurality of charged particle beams generated by the aperture array 103.

When m, n, and i are natural numbers, M is a natural number equal to or larger than m, and N is a natural number equal to or larger than n, the aperture array (generation unit) 103 can generate M×N charged particle beams arranged such that M columns each including N charged particle beams arranged at a first pitch along the X direction exist at a second pitch along the Y direction. The X-position of a charged particle beam at the start of each column shifts by 1/m the first pitch in the first to mth columns out of the M columns. The M×N charged particle beams are arranged such that the X-position of a charged particle beam at the start of an (m+i)th column is the same as the X-position of a charged particle beam at the start of an ith column. Assume that drawing on the substrate 110 is performed using M×n charged particle beams including n columns out of the N columns of charged particle beams. In this case, defining a stripe area SA drawn by m charged particle beams in which the X position of the charged particle beam at the start changes between the rows as one cycle, the charged particle beams draw the stripe area SA in which the areas of n cycles are adjacent. With this method, a drawing area EA tightly filled with m×n stripe areas SA is drawn on the substrate 110. In the example shown in FIG. 2D, M=m=4, and N=n=8.

In the above-described multi-beam type, if a beam (abnormal beam) that does not satisfy use conditions is present, the abnormal beam draws a defective stripe drawing area. The abnormal beam is (1) a charged particle beam including a sub-beam that does not satisfy desired characteristics, or (2) a charged particle beam including a sub-beam that cannot individually be turned on/off.

First Embodiment

Figure 3:
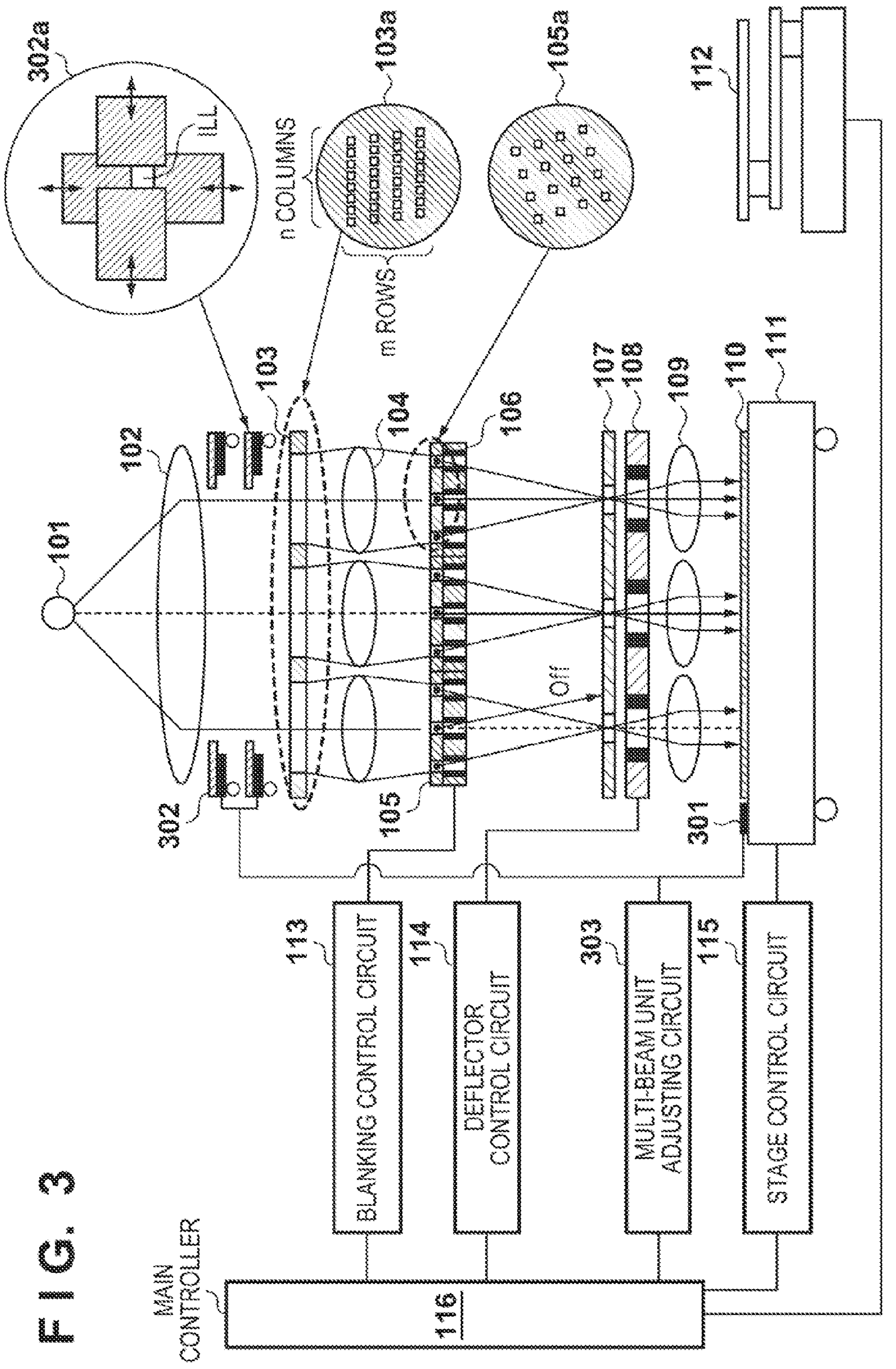
FIG. 3 is a view showing an arrangement example according to the first embodiment.

FIG. 3 shows an example of the arrangement of a drawing apparatus according to the first embodiment. A measuring device 301 measures the characteristics of sub-beams including the opening pattern on which the sub-beams are incident. The two stages of a shutter 302 can move in a plane almost perpendicular to the optical axis independently of each other. The upper and lower stages are arranged on a substrate stage 111 to be movable independently. A portion 302*a* in FIG. 3 represents the shutter 302 viewed from the upper side along the optical axis. When viewed from a substrate 110, it appears that only charged particle beams corresponding to an area (ILL in FIG. 3) limited by the shutter 302 are selectively generated. A multi-beam unit adjusting circuit 303 adjusts the shutter 302 based on the measurement result of the measuring device 301. In this embodiment, as shown in FIG. 3, the measuring device 301, the shutter 302, and the multi-beam unit adjusting circuit 303 are provided in addition to the arrangement in FIG. 1. In the example shown in FIG. 3, rectangular openings are arranged on an aperture array 103 and a pattern opening array 105. However, the openings can have an arbitrary shape. In the first embodiment, the shutter 302 forms a limiting device that limits the number of charged particle beams to irradiate the substrate 110.

Figure 4:
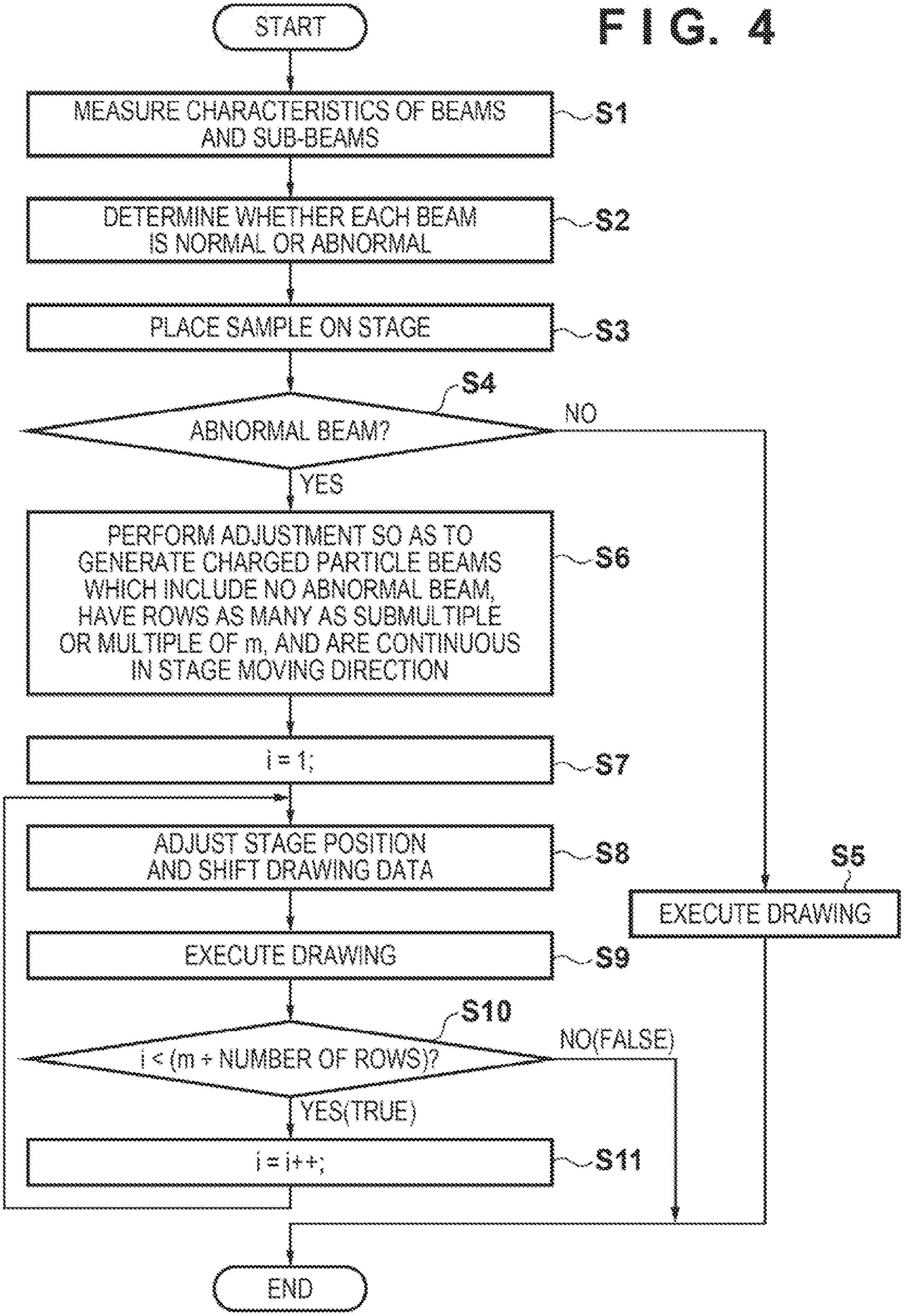
FIG. 4 is a flowchart showing a drawing procedure according to the embodiment.

A drawing procedure according to the first embodiment will be described next with reference to the flowchart of FIG. 4. In step S1, the multi-beam unit adjusting circuit 303 measures the characteristics of each of a plurality of sub-beams using the measuring device 301. At this time, the measuring device 301 may measure the characteristics of each charged particle beam on the basis of each sub-beam group from one sub-array. In step S2, the multi-beam unit adjusting circuit 303 arithmetically processes the measurement result of the measuring device 301 to determine whether an abnormal beam exists in the generated charged particle beams. Steps S1 and S2 can be performed either at the time of shipment, installation, maintenance or the like of the apparatus without article manufacture or immediately before or during actual drawing. In step S3, a main controller 116 places the substrate 110 on the substrate stage 111 using a conveyance mechanism 112. In step S4, the main controller 116 determines whether an abnormal beam exists. Upon determining that no abnormal beam exists, the main controller 116 executes drawing on the substrate 110 by on/off-controlling each sub-beam based on pattern data in step S5, thus completing the procedure.

Upon determining that an abnormal beam exists, the multi-beam unit adjusting circuit 303 adjusts the multi-beam unit or the optical system so that the substrate 110 is irradiated with charged particle beams that satisfy the following three conditions. As the three conditions, the charged particle beams (1) include no abnormal beam, (2) have rows as many as a submultiple or a multiple of m, and (3) are usable continuously in the moving direction of the substrate stage 111. The number m of rows is a numerical value stored in the apparatus (the main controller 116 and the multi-beam unit adjusting circuit 303) in advance as the design value of the opening arrangement on an aperture array 103.

In step S7, the main controller 116 has an integer i set to an initial value "1" for counting the drawing conditions. In step S8, the main controller 116 adjusts the position of the substrate stage 111 and shifts the drawing data so that the subsequent procedure loops a minimum number of times. In step S9, the main controller 116 executes drawing on the substrate 110 by on/off-controlling each sub-beam based on appropriate pattern data for the charged particle beams generated after the adjustment by the multi-beam unit adjusting circuit 303 so as to be used for drawing. In step S10, using the current i, m, and the number of rows of charged particle beams to be used for drawing, the main controller 116 determines whether a logical expression i<(m÷number of rows) is true. If the determination result is false, that is, if the current i equals (m÷number of rows), the procedure is completed. If the determination result is true, that is, if the current i is smaller than (m÷number of rows), the main controller 116 increments i in step S11, and the procedure from step S8 loops again. In the first embodiment, the main controller 116 and the multi-beam unit adjusting circuit 303 form a controller that determines the presence/absence of an abnormal beam and controls the shutter 302 serving as a limiting device based on the determination result.

EXAMPLE 1

A drawing apparatus of Example 1 will be explained with reference to FIG. 3. In Example 1, a charged particle source 101 in FIG. 3 is a so-called thermionic emission electron source unit containing $LaB_6$, BaO/W (dispenser cathode), or the like as an electron emission material. The characteristics to be measured by the measuring device 301 include (1) excellent on/off-control, (2) arrival position on the substrate 110, (3) the current values of a charged particle beam and its sub-beams, and (4) the shapes of a charged particle beam and its sub-beams. Normality/abnormality is determined, including the temporal stability of one or some of the above-described four characteristics.

Figure 5A:
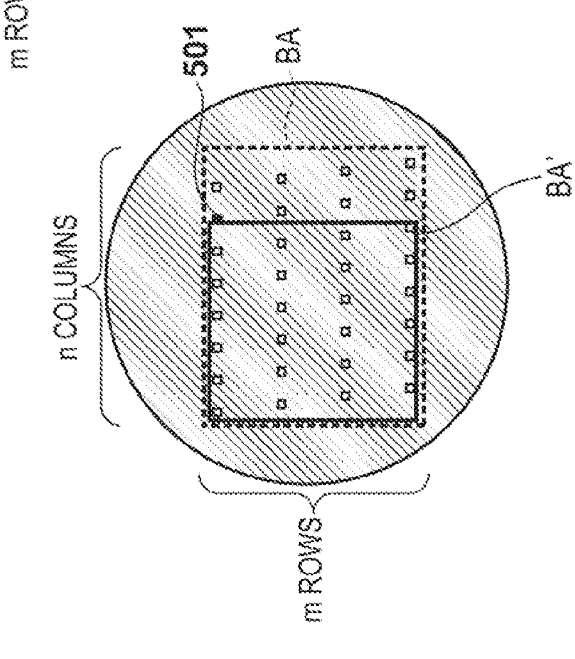
FIGS. 5A and 5B are views showing an example in which drawing beams are selected in Example 1.
Figure 5B:
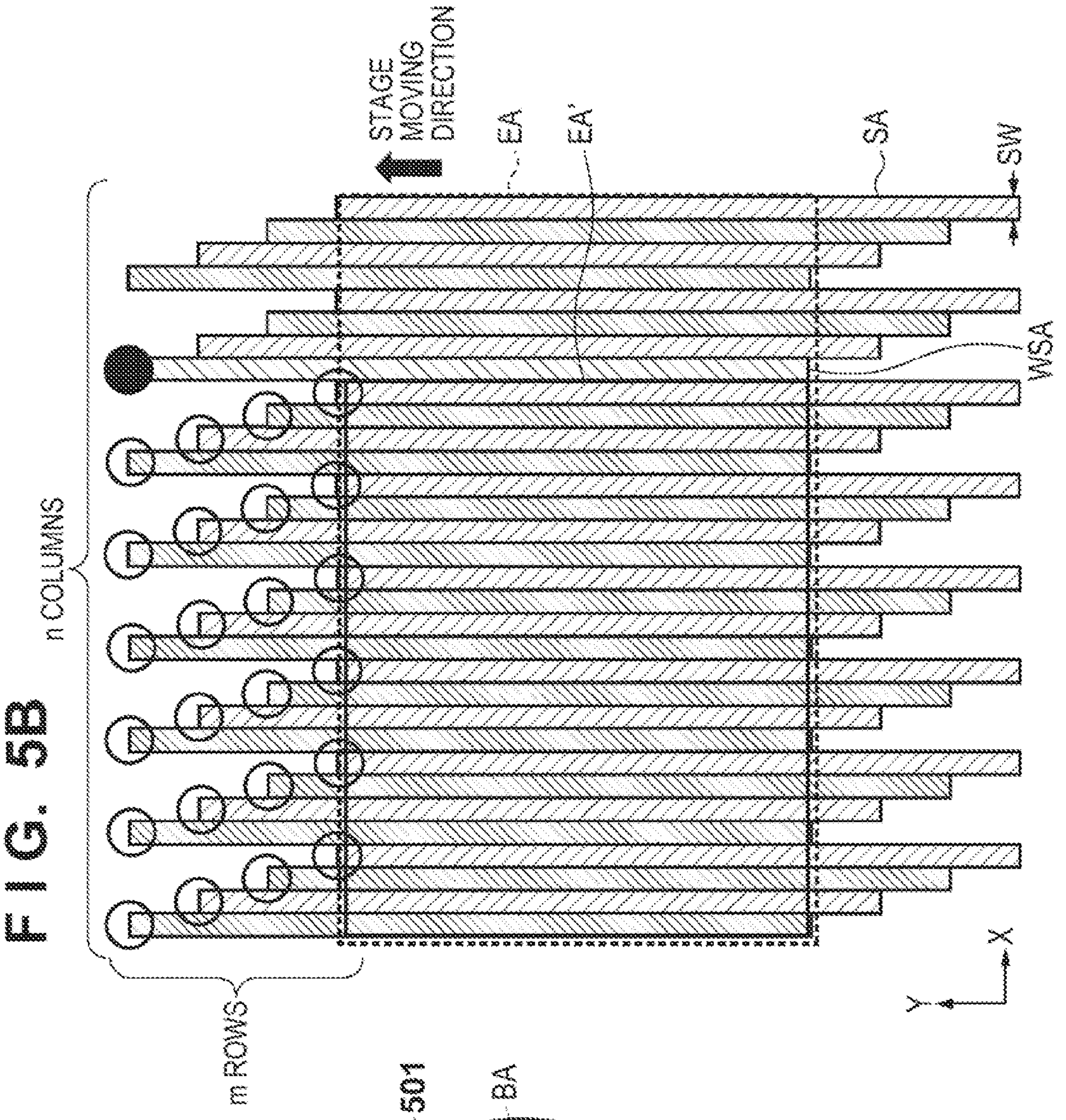

FIGS. 5A and 5B show an example in which charged particle beams to be used for drawing are selected in Example 1. FIG. 5A shows the charged particle beams to be used for drawing using the aperture array 103. An opening 501 is a defective opening for which at least one sub-beam out of a sub-beam group generated by dividing a charged particle beam that has passed through the opening is determined as abnormal. The multi-beam unit adjusting circuit 303 adjusts the shutter 302 so as to generate the charged particle beams not from a beam area BA, as in a related art, but from an adjusted beam area BA'. More specifically, the opening width of each of the two stages of the shutter 302 is adjusted to change the target irradiation area (corresponding to ILL) of the aperture array 103. In Example 1, the blades for limiting the number of X-direction charged particle beams that pass through the shutter 302 and the blades for limiting the number of Y-direction charged particle beams are held by the stages that are movable independently of each other. At this time, the substrate 110 is irradiated with charged particle beams which include no abnormal beam, have m rows, and are continuous in the moving direction of the substrate stage 111.

In the example shown in FIGS. 5A and 5B, m=4, n=8, and charged particle beams in 4 rows×6 columns are generated from the beam area BA'. In this case, since (m÷number of rows)=1, the determination of step S10 ends with "false" in the first loop. FIG. 5B explains the positional relationship of the stripe drawing areas drawn on the substrate 110 by the selected charged particle beams. Each open circle in FIG. 5B corresponds to a selected charged particle beam, and a full circle corresponds to the defective opening 501. Since no charged particle beam is generated from the defective opening 501, a defective stripe drawing area WSA is not drawn. In the example shown in FIGS. 5A and 5B, only the charged particle beams indicated by the open circles in 4 rows×6 columns perform drawing so that a drawing area EA' is drawn on the substrate 110. Influence of selecting the charged particle beams to be used for drawing appears as the drawing area and, in turn, results in a lower throughput. In FIGS. 5A and 5B, the throughput is 75%.

EXAMPLE 2

Figure 6:
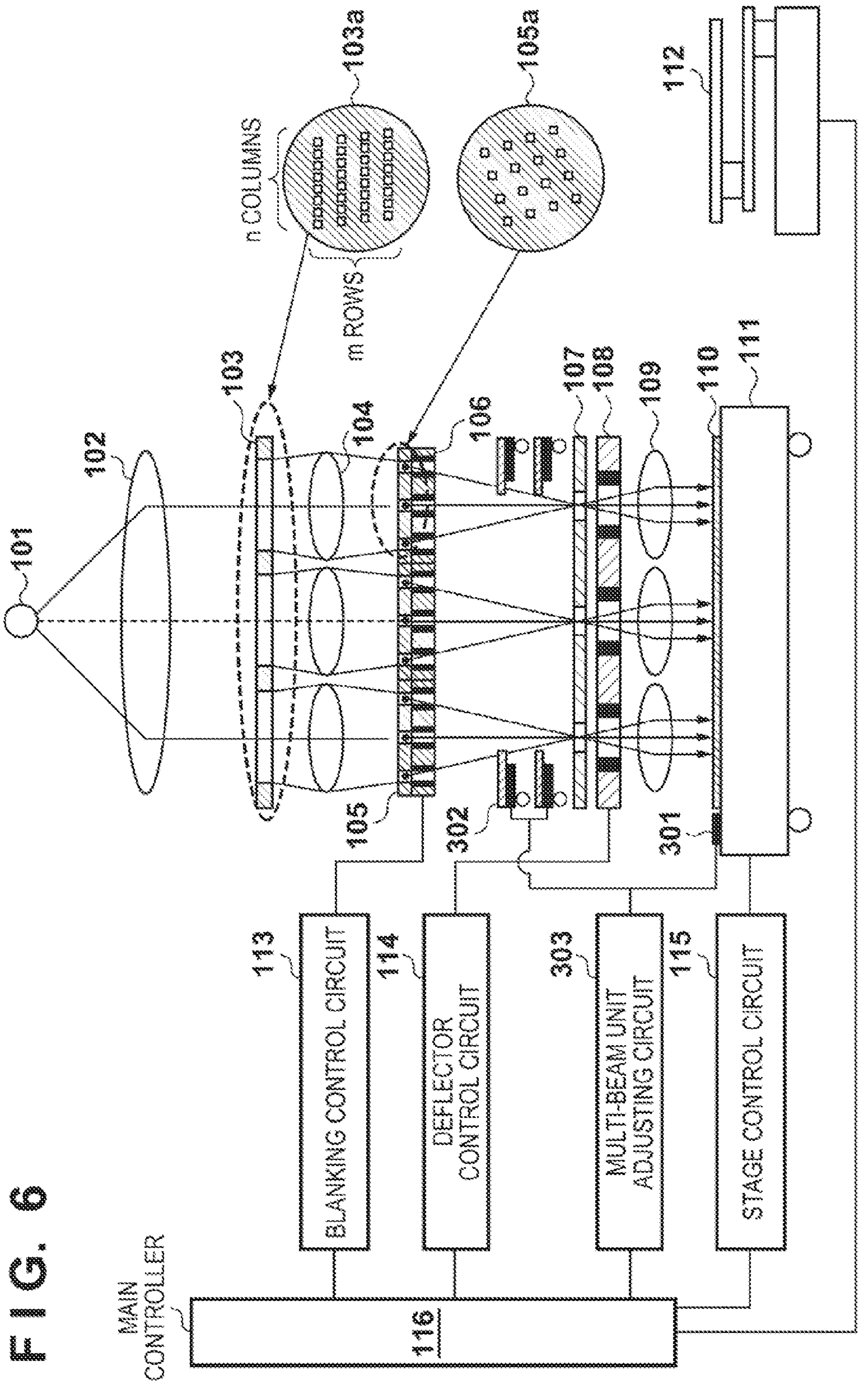
FIG. 6 is a view for explaining a drawing apparatus according to Example 2.

An electron beam drawing apparatus of Example 2 will be described with reference to FIG. 6. Example 2 is a modification of Example 1. In FIG. 6, the shutter 302 is arranged between a blanker array 106 and a blanking aperture 107. In Example 2, the shutter 302 does not change the irradiation range of the aperture array 103 but shields charged particle beams with respect to the substrate 110 independently of the blankers. Out of the charged particle beams generated by the aperture array 103, only charged particle beams passing through the area ILL limited by the shutter 302 arrive at the substrate 110. For this reason, the same effect as that obtained by selecting the charged particle beams to be used for drawing can be obtained. In Example 2, the shutter 302 is provided between the blanker array 106 and the blanking aperture 107. In principle, however, the same effect as that obtained by selecting the charged particle beams to be used for drawing can be obtained irrespective of the position of the shutter that is arranged between the charged particle source 101 and the substrate 110.

Second Embodiment

Figure 7:
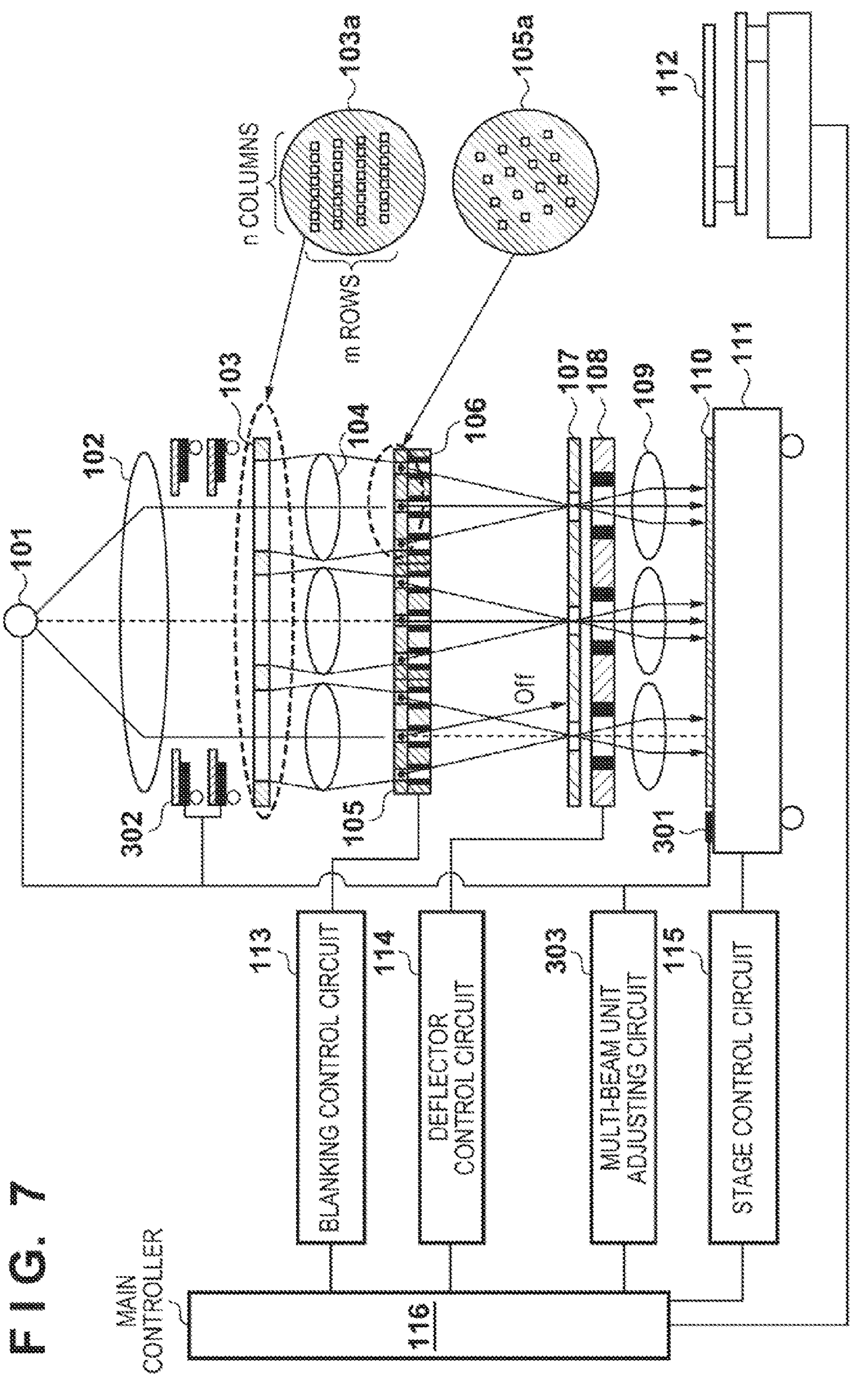
FIG. 7 is a view showing an arrangement example according to the second embodiment.

FIG. 7 shows an example of the arrangement of a drawing apparatus according to the second embodiment. In the example shown in FIG. 7, a multi-beam unit adjusting circuit 303 can adjust not only a shutter 302 but also the characteristics of a charged particle source 101.

EXAMPLE 3

Figure 8:
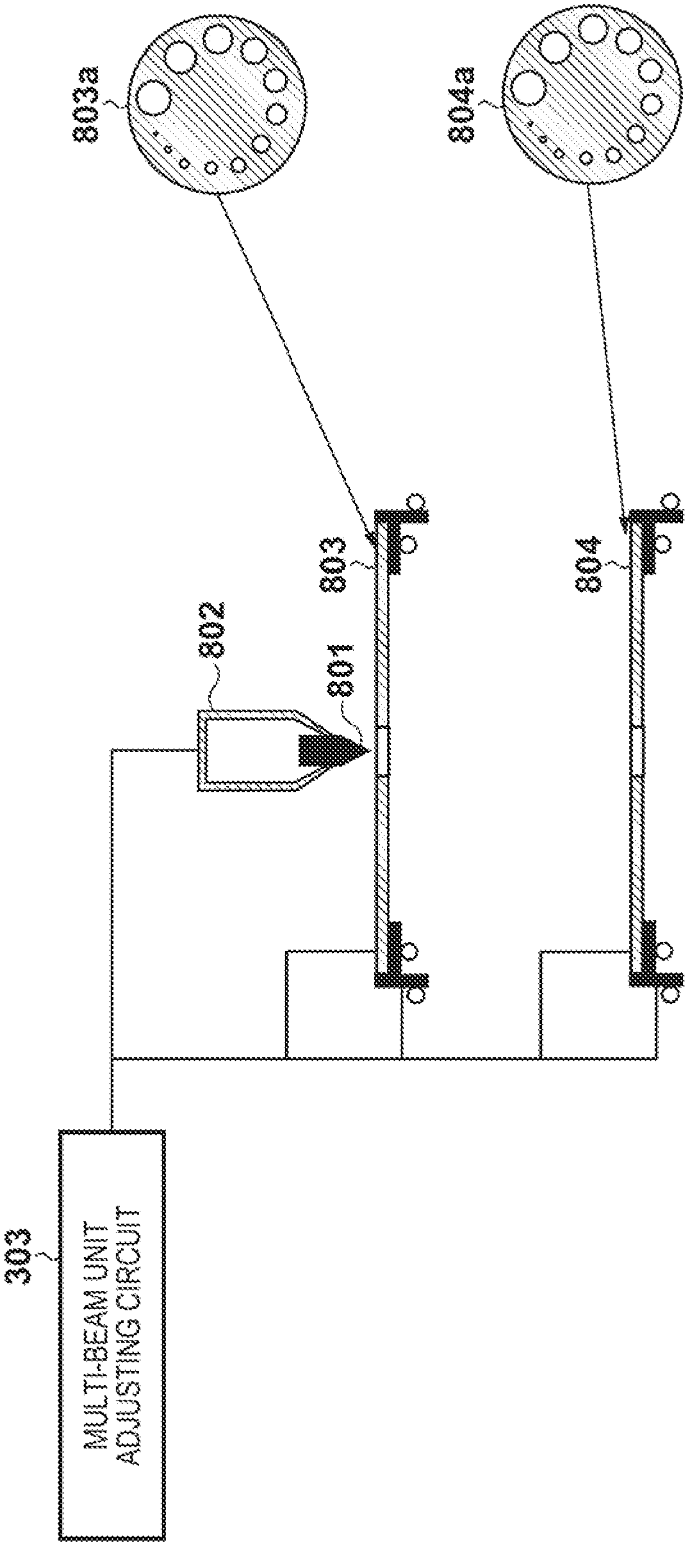
FIG. 8 is a view for explaining adjustment of the characteristics of an electron source unit according to the third embodiment.

An electron beam drawing apparatus of Example 3 belonging to the second embodiment will be described with reference to FIG. 7. In Example 3 as well, the charged particle source 101 is a thermionic emission electron source unit. FIG. 8 shows an arrangement example in which the multi-beam unit adjusting circuit (adjusting device) 303 adjusts the characteristics of the charged particle source 101 (electron source unit). A cathode electrode 801 emits electrons. A filament electrode 802 holds the cathode electrode 801 and supplies a current to generate heat. A Wehnelt electrode 803 limits electron emission from portions other than the end of the cathode electrode 801. An anode electrode 804 controls the electrons emitted by the cathode electrode 801. Portions 803*a* and 804*a* in FIG. 8 represent the Wehnelt electrode 803 and the anode electrode 804 viewed from the upper side, respectively, and have openings with different diameters arranged on them. Since the Wehnelt electrode 803 and the anode electrode 804 can move independently, the openings through which the emitted electrons pass or the electrode interval can arbitrarily be changed. In addition, voltages are applied to the Wehnelt electrode 803 and the anode electrode 804.

The multi-beam unit adjusting circuit 303 changes (1) the current to be supplied to the filament electrode 802 (cathode electrode 801), (2) the voltages to be applied to the Wehnelt electrode 803 and the anode electrode 804, and (3) the distances between the electrodes. This allows the multi-beam unit adjusting circuit 303 to adjust the characteristics of the electron source unit. The characteristics of the electron source unit include (1) the crossover diameter, (2) the angle of radiation, and (3) the luminance of the charged particle beams.

Figure 9B:
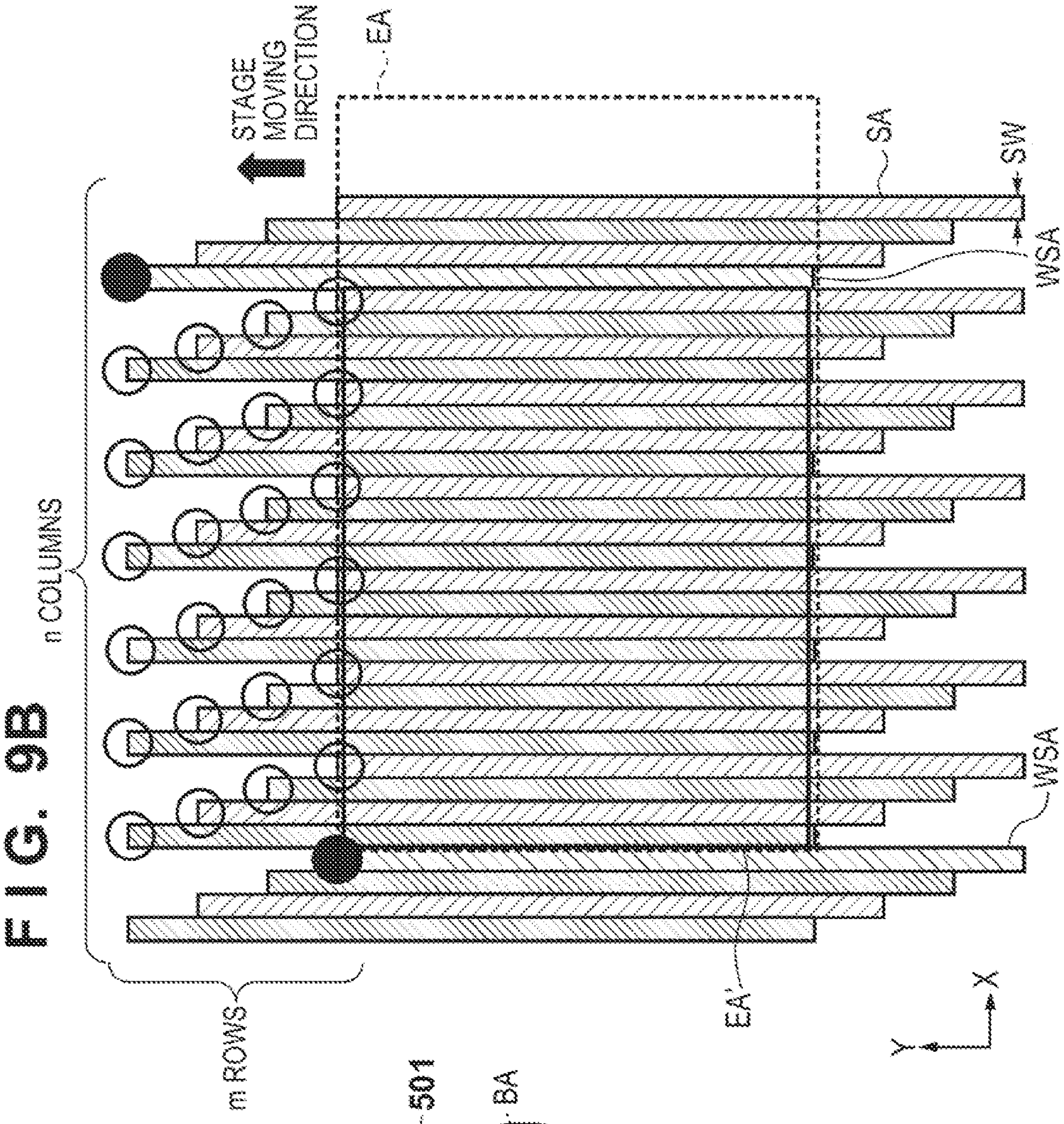
FIGS. 9A and 9B are views showing an example in which drawing beams are selected in Example 3.
Figure 9A:
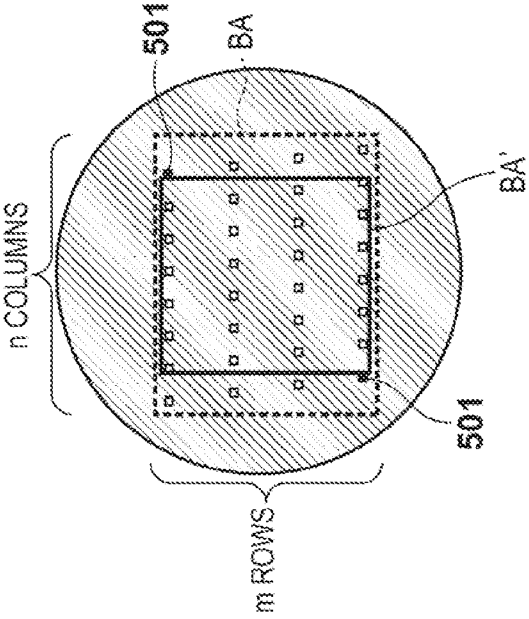

FIGS. 9A and 9B show an example in which charged particle beams to be used for drawing are selected in Example 3. FIG. 9A shows the charged particle beams to be used for drawing using an aperture array 103. The multi-beam unit adjusting circuit 303 changes the irradiation area of the aperture array 103 by the shutter 302. In addition, the multi-beam unit adjusting circuit 303 adjusts the characteristics of the electron source unit so as to decrease the emittance (depending on the crossover diameter and the angle of radiation) while maintaining the current density in the irradiation area. At this time, a substrate 110 is irradiated with charged particle beams which include no abnormal beam, have m rows, and are continuous in the moving direction of a substrate stage 111. In the example shown in FIGS. 9A and 9B, m=4, n=8, and charged particle beams in 4 rows×6 columns are generated from a beam area BA'. In this case, since (m÷number of rows)=1, the determination of step S10 ends with “false” in the first loop. Reducing the emittance as in Example 3 allows to obtain an effect of prolonging the life of the electron source unit.

FIG. 9B explains the positional relationship of the stripe drawing areas drawn on the substrate 110 by the selected charged particle beams. In the example shown in FIGS. 9A and 9B, only the charged particle beams indicated by the open circles in 4 rows×6 columns perform drawing so that a drawing area EA' is drawn on the substrate 110. Note that the main controller 116 adjusts the position of the substrate stage 111 so that the procedure loops a minimum number of times, and the drawing area EA' starts from an end of a drawing area EA (left end in FIG. 9B). Influence of selecting the charged particle beams to be used for drawing appears as the drawing area and, in turn, results in a lower throughput. In FIGS. 9A and 9B, the throughput is 75%.

Third Embodiment

Figure 10:
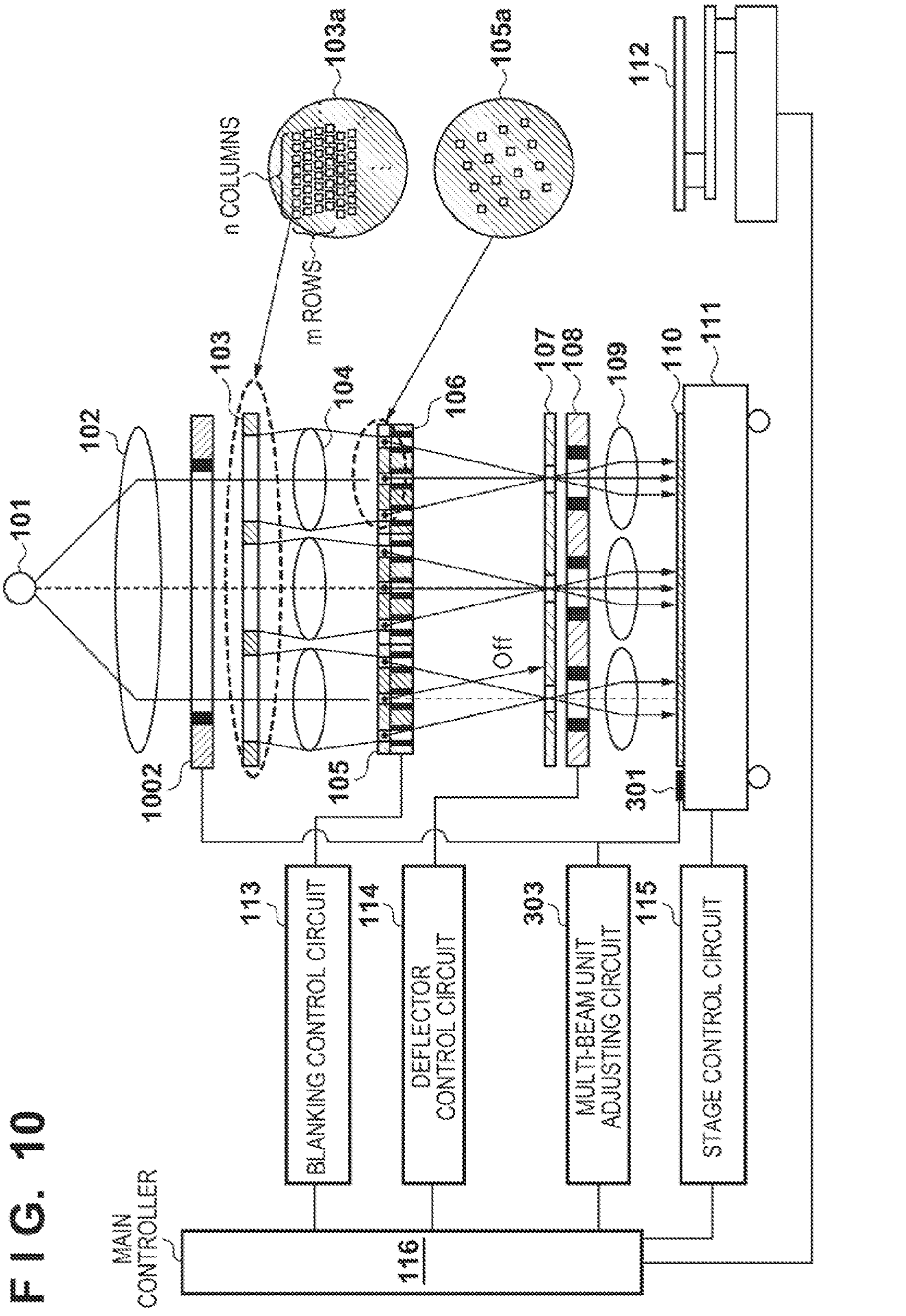
FIG. 10 is a view showing an arrangement example according to the third embodiment.

FIG. 10 shows an example of the arrangement of a drawing apparatus according to the third embodiment. In an aperture array 103, rows with openings arranged at an equal interval are periodically arranged two-dimensionally. A portion 103*a* in FIG. 10 represents the aperture array 103 viewed from the upper side along the optical axis. Each row has n or more openings arranged at an equal interval, and m or more rows are arranged to be repetitive at a cycle of (m+1) rows. The aperture array 103 has M rows (M≥m) and can partially be illuminated to generate at least M×n charged particle beams. A condenser lens array 104, a pattern opening array 105, a blanker array 106, a blanking aperture array 107, a deflector array 108, and an objective lens array 109 handle with all charged particle beams that can be generated by the aperture array 103. As a result, all charged particle beams that can be generated by the aperture array 103 converge on a substrate 110. In the example shown in FIG. 10, a multi-beam unit adjusting circuit 303 can adjust a deflector 1002 serving as a limiting device so as to change the charged particle beam incident range of the aperture array 103.

EXAMPLE 4

Figure 11:
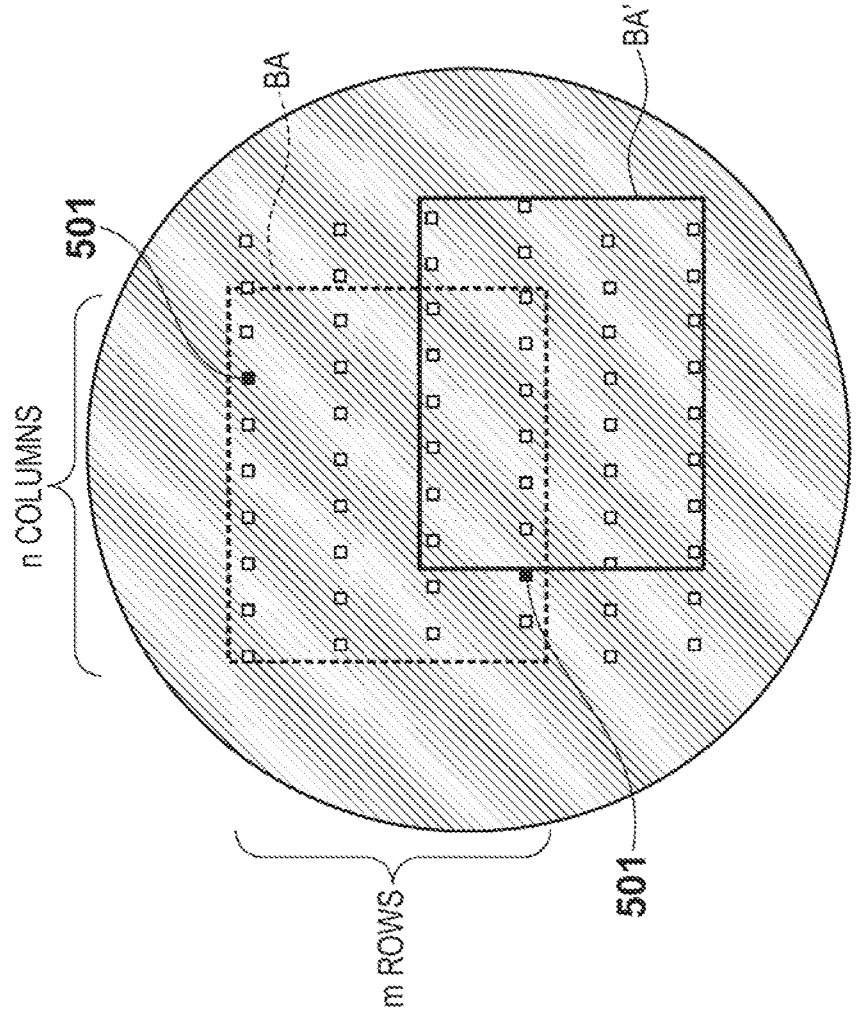
FIG. 11 is a view showing an example in which drawing beams are selected in Example 4.

An electron beam drawing apparatus of Example 4 belonging to the third embodiment will be described with reference to FIG. 10. In Example 4 as well, a charged particle source 101 is a thermionic emission electron source unit. FIG. 11 shows an example in which charged particle beams to be used for drawing are selected in Example 4. FIG. 11 shows the charged particle beams to be used for drawing using the aperture array 103. The multi-beam unit adjusting circuit 303 adjusts the deflector 1002 to illuminate only a beam area BA' on the aperture array 103. At this time, the substrate 110 is irradiated with charged particle beams which include no abnormal beam, have m rows, and are continuous in the moving direction of a substrate stage 111. In the example shown in FIG. 11, m=4, n=8, and charged particle beams in 4 rows×8 columns are generated from the beam area BA'. In this case, since (m÷number of rows)=1, the determination of step S10 ends with “false” in the first loop. When the position of the substrate stage 111 is adjusted such that the drawing area EA' drawn on the substrate 110 by the charged particle beams in 4 rows×8 columns is the same as the drawing area EA, the throughput does not lower. In this example, the throughput is 100% because drawing can be performed using charged particle beams in m rows×n columns regardless of the presence of a defective opening 501.

Fourth Embodiment

Figure 12:
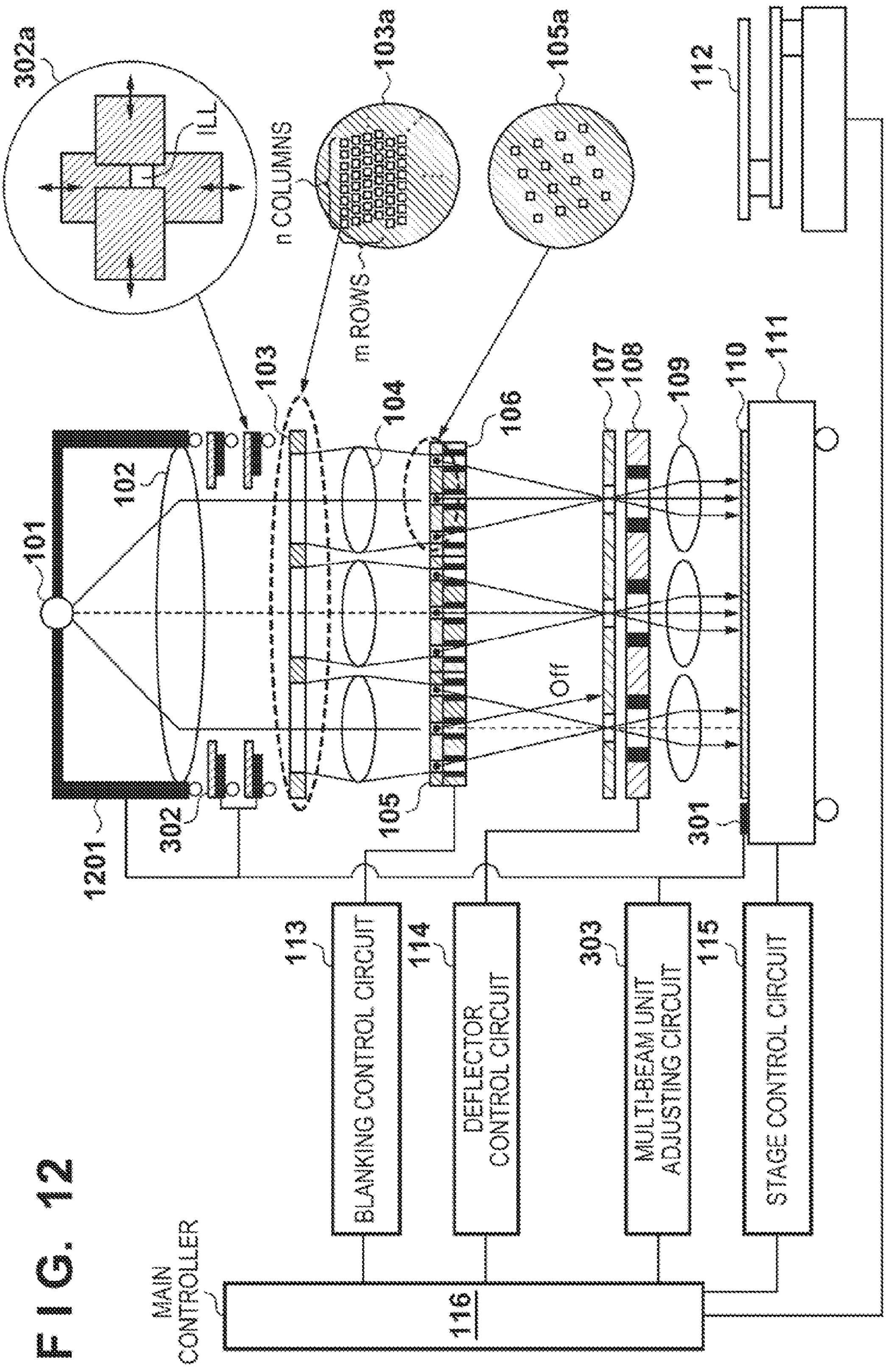
FIG. 12 is a view showing an arrangement example according to the fourth embodiment.

FIG. 12 shows an example of the arrangement of a drawing apparatus according to the fourth embodiment. A light source stage 1201 moves a charged particle source 101 and a collimator lens 102 with respect to an aperture array 103. In the example shown in FIG. 12, a multi-beam unit adjusting circuit 303 can move the light source stage 1201 so as to change the irradiation range of the aperture array 103.

EXAMPLE 5

Figure 13B:
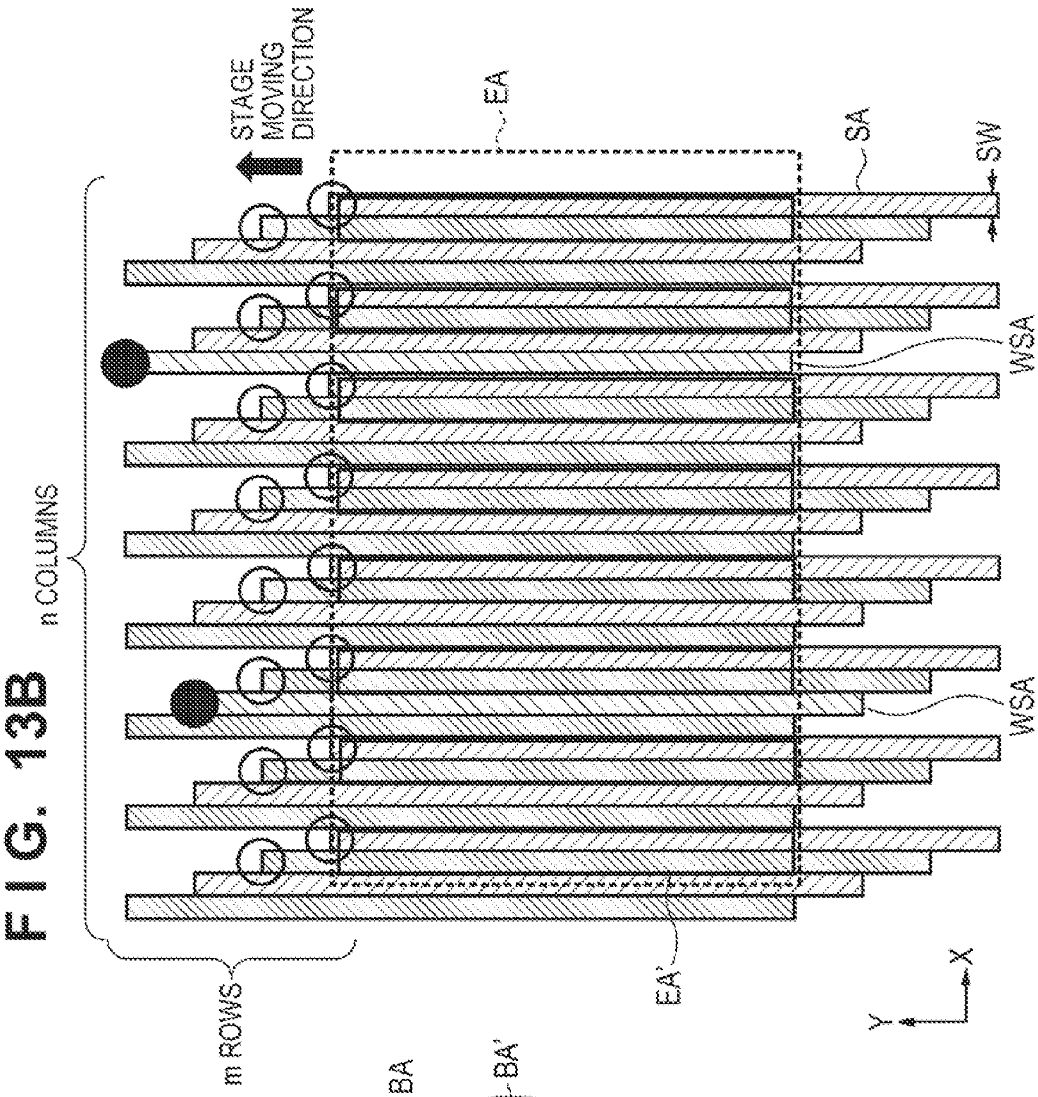
FIGS. 13A and 13B are views showing an example in which drawing beams are selected in Example 5.
Figure 13A:
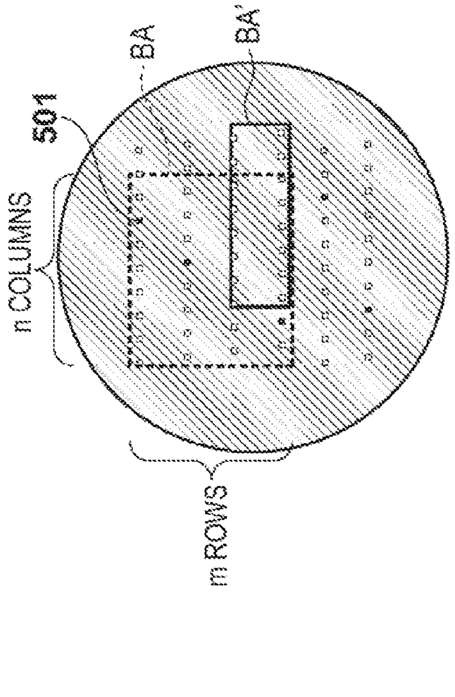

An electron beam drawing apparatus of Example 5 belonging to the fourth embodiment will be described with reference to FIG. 12. In Example 5 as well, the charged particle source 101 is a thermionic emission electron source unit. FIGS. 13A and 13B show an example in which charged particle beams to be used for drawing are selected in Example 5. FIG. 13A shows the charged particle beams to be used for drawing using the aperture array 103. The multi-beam unit adjusting circuit 303 adjusts the light source stage 1201 and a shutter 302 so as to illuminate only a beam area BA' on the aperture array 103. At this time, a substrate 110 is irradiated with charged particle beams which include no abnormal beam, have rows as many as a submultiple of m, and are continuous in the moving direction of a substrate stage 111.

In the example shown in FIGS. 13A and 13B, m=4, n=8, and charged particle beams in 2 rows×8 columns are generated from the beam area BA'. In this case, since (m÷number of rows)≠1, the determination of step S10 ends with "true" in the first loop. Only the charged particle beams indicated by the open circles in 2 rows×8 columns perform drawing so that a drawing area EA' is drawn on the substrate 110. A main controller 116 performs redrawing from the second loop so as to complement the intervals of the drawing areas EA' using the same charged particle beam group until i=(m÷number of rows). Influence of selecting the charged particle beams to be used for drawing appears as the number of times of redrawing and, in turn, results in a lower throughput. In the example shown in FIGS. 13A and 13B, the throughput is 50%.

In the drawing apparatus according to each of the first to fourth embodiments, charged particle beam selection is done by the blanking control circuit 113, the deflector control circuit 114, the stage control circuit 115, the multi-beam unit adjusting circuit 303, and the main controller 116. However, this is merely an example, and changes and modifications can be made as needed. The electron beam drawing apparatus according to each of Examples 1 to 5 draws a pattern on the substrate 110 by a plurality of electron beams. However, charged particle beams such as ion beams other than the electron beams may be used. These apparatuses can be generalized to a drawing apparatus for drawing a pattern on the substrate 110 using a plurality of charged particle beams.

[Article Manufacturing Method]

An article manufacturing method according to an embodiment of the present invention is suitable for manufacturing an article, for example, a micro device such as a semiconductor device or an element having a microstructure. The manufacturing method can include a step of forming a latent image pattern on a photoresist applied to a substrate using the above-described drawing apparatus (a step of performing drawing on a substrate), and a step of developing the substrate on which the latent image pattern has been formed in that step. The manufacturing method can also include other known steps (oxidation, deposition, vapor deposition, doping, planarization, etching, resist peeling, dicing, bonding, packaging, and the like). The manufacturing method of this embodiment is more advantageous than a conventional method in at least one of article performance, quality, productivity, and production cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-206558 filed Sep. 21, 2011, which is hereby incorporated by reference herein in its entirety.

What is claimed is:

1. A drawing apparatus for performing drawing on a substrate with charged particle beams, the apparatus comprising:

a charged particle optical system configured, letting m, n, and i be natural numbers, letting M be a natural number not less than m, and letting N be a natural number not less than n, to generate M×N charged particle beams arranged such that M rows, each including N charged particle beams arranged at a first pitch along a first direction, exist at a second pitch along a second direction perpendicular to the first direction, a position, in the first direction, of a charged particle beam at a start of each row shifts by 1/m the first pitch in first to mth rows out of the M rows, and a position, in the first direction, of a charged particle beam at a start of an (m+i)th row is the same as a position, in the first direction, of a charged particle beam at a start of an ith row;

a substrate stage configured to hold the substrate and to be moved along the second direction;

a limiting device configured to limit number of charged particle beams that the charged particle optical system emits toward the substrate; and a controller configured, if an abnormal beam that does not satisfy a use condition is present among the M×N charged particle beams, to control the limiting device such that only m rows, successive along the second direction, are usable, each of the m rows including n charged particle beams that are successive without intervention of the abnormal beam.

2. A drawing apparatus for performing drawing on a substrate with charged particle beams, the apparatus comprising:

a charged particle optical system configured, letting m, n, and i be natural numbers, letting M be a natural number not less than m, and letting N be a natural number not less than n, to generate M×N charged particle beams arranged such that M rows, each including N charged particle beams arranged at a first pitch along a first direction, exist at a second pitch along a second direction perpendicular to the first direction, a position, in the first direction, of a charged particle beam at a start of each row shifts by 1/m the first pitch in first to mth rows out of the M rows, and a position, in the first direction, of a charged particle beam at a start of an (m+i)th row is the same as a position, in the first direction, of a charged particle beam at a start of an ith row;

a substrate stage configured to hold the substrate and to be moved along the second direction;

a limiting device configured to limit number of charged particle beams that the charged particle optical system emits toward the substrate; and a controller configured, if an abnormal beam that does not satisfy a use condition is present among the M×N charged particle beams, to control the limiting device such that only rows as many as a submultiple of m, which are successive along the second direction, are usable, each of the only rows including n charged particle beams that are successive without intervention of the abnormal beam.

3. A drawing apparatus for performing drawing on a substrate with charged particle beams, the apparatus comprising:

a charged particle optical system configured, letting m, n, and i be natural numbers, letting M be a natural number not less than m, and letting N be a natural number not less than n, to generate M×N charged particle beams arranged such that M rows, each including N charged particle beams arranged at a first pitch along a first direction, exist at a second pitch along a second direction perpendicular to the first direction, a position, in the first-direction, of a charged particle beam at a start of each row shifts by 1/m the first pitch in first to mth rows out of the M rows, and a position, in the first-direction, of a charged particle beam at a start of an (m+i)th row is the same as a position, in the first-direction, of a charged particle beam at a start of an ith row;

a substrate stage configured to hold the substrate and to be moved along the second direction;

a limiting device configured to limit number of charged particle beams that the charged particle optical system emits toward the substrate; and a controller configured, if an abnormal beam that does not satisfy a use condition is present among the M×N charged particle beams, to control the limiting device such that only rows as many as a multiple of m, which are successive along the second direction, are usable, each of the only rows including n charged particle beams that are successive without intervention of the abnormal beam.

4. The apparatus according to claim 1, wherein the limiting device includes a deflector configured to individually blank the M×N charged particle beams.

5. The apparatus according to claim 1, wherein the limiting device includes a shutter configured to shield a part of the M×N charged particle beams.

6. The apparatus according to claim 5, wherein the shutter includes a blade that limits number of charged particle beams passing through the shutter in the first direction, and a blade that limits number of charged particle beams passing through the shutter in the second direction.

7. The apparatus according to claim 1, further comprising a charged particle source configured to generate a charged particle beams to be incident on the charged particle optical system, wherein the limiting device includes an adjusting device configured to adjust a characteristic of the charged particle source.

8. The apparatus according to claim 7, wherein the characteristic includes at least one of a crossover diameter, a radiation angle, and a luminance of the charged particle beam generated by the charged particle source.

9. The apparatus according to claim 1, wherein the charged particle optical system includes an aperture array configured to divide a charged particle beams incident thereon into a plurality of charged particle beams, and the limiting device includes a deflector configured to change a range of the aperture array on which the charged particle beams is incident.

10. The apparatus according to claim 1, further comprising a charged particle source configured to generate a charged particle beam to be incident on the charged particle optical system, wherein the charged particle optical system includes an aperture array configured to divide a charged particle beams incident thereon into a plurality of charged particle beams, and the limiting device is configured to move the charged particle source to change a range of the aperture array on which the charged particle beams is incident.

11. A method of manufacturing an article, the method comprising:

performing drawing on a substrate using a drawing apparatus;

developing the substrate on which the drawing has been performed; and processing the developed substrate, wherein the drawing apparatus performs the drawing on the substrate with charged particle beams, the apparatus including:

a charged particle optical system configured, letting m, n, and i be natural numbers, letting M be a natural number not less than m, and letting N be a natural number not less than n, to generate M×N charged particle beams arranged such that M rows, each including N charged particle beams arranged at a first pitch along a first direction, exist at a second pitch along a second direction perpendicular to the first direction, a position, in the first direction, of a charged particle beam at a start of each row shifts by 1/m the first pitch in first to mth rows out of the M rows, and a position, in the first direction, of a charged particle beam at a start of an (m+i)th row is the same as a position, in the first direction, of a charged particle beam at a start of an ith row;

a substrate stage configured to hold the substrate and to be moved along the second direction;

a limiting device configured to limit number of charged particle beams that the charged particle optical system emits toward the substrate; and a controller configured, if an abnormal beam that does not satisfy a use condition is present among the M×N charged particle beams, to control the limiting device such that only m rows, successive along the second direction, are usable, each of the m rows including n charged particle beams that are successive without intervention of the abnormal beam.

12. A drawing apparatus for performing drawing on a substrate with charged particle beams, the apparatus comprising:

a charged particle optical system configured to generate a plurality of charged particle beams arranged such that a plurality of rows, each of the plurality of rows including charged particle beams arranged at a first pitch along a first direction, exist at a second pitch along a second direction perpendicular to the first direction, and a position, in the first direction, of a charged particle beam at a start of each row shifts by a predetermined pitch in the plurality of rows;

a substrate stage configured to hold the substrate and to be moved along the second direction;

a limiting device configured to limit number of charged particle beams that the charged particle optical system emits toward the substrate; and a controller configured, if an abnormal beam that does not satisfy a use condition is present among the plurality of charged particle beams, to control the limiting device such that only the plurality of rows, only rows as many as a submultiple of number of rows of the plurality of rows (except the number of rows), or only rows as many as a multiple of number of rows of the plurality of rows (except the number of rows), successive along the second direction, are usable, each row including a plurality of charged particle beams that are successive without intervention of the abnormal beam.

13. A method of manufacturing an article, the method comprising:

performing drawing on a substrate using a drawing apparatus;

developing the substrate on which the drawing has been performed; and processing the developed substrate, wherein the drawing apparatus performs the drawing on the substrate with charged particle beams, the apparatus including:

a charged particle optical system configured to generate a plurality of charged particle beams arranged such that a plurality of rows, each of the plurality of rows including charged particle beams arranged at a first pitch along a first direction, exist at a second pitch along a second direction perpendicular to the first direction, and a position, in the first direction, of a charged particle beam at a start of each row shifts by a predetermined pitch in the plurality of rows;

a substrate stage configured to hold the substrate and to be moved along the second direction;

a limiting device configured to limit number of charged particle beams that the charged particle optical system emits toward the substrate; and a controller configured, if an abnormal beam that does not satisfy a use condition is present among the plurality of charged particle beams, to control the limiting device such that only the plurality of rows, only rows as many as a submultiple of number of rows of the plurality of rows (except the number of rows), or only rows as many as a multiple of the number of rows (except the number of rows), successive along the second direction, are usable, each row including a plurality of charged particle beams that are successive without intervention of the abnormal beam.

* * * * *